United States Patent [19]
Quinn

[11] Patent Number: 4,692,712
[45] Date of Patent: Sep. 8, 1987

[54] DIFFERENTIAL IMPEDANCE NEUTRALIZATION CIRCUIT

[75] Inventor: Patrick A. Quinn, Aloha, Oreg.

[73] Assignee: Tektronix, Inc., Beaverton, Oreg.

[21] Appl. No.: 917,867

[22] Filed: Oct. 14, 1986

[51] Int. Cl.$^4$ .......................... H03F 3/45; H03F 1/26
[52] U.S. Cl. .................................. 330/261; 330/149
[58] Field of Search ............... 330/252, 260, 261, 149, 330/257

[56] References Cited
U.S. PATENT DOCUMENTS
4,476,440 10/1984 Bennett .............................. 330/260

Primary Examiner—Gene Wan
Attorney, Agent, or Firm—Mark L. Becker

[57] ABSTRACT

An impedance neutralization circuit produces correction currents to compensate for the effects of parasitic impedance on the output voltage of an amplifier. In the described embodiment, the neutralization circuit includes a pair of emitter followers, one coupled to the collector of each transistor of a common base amplifier for sensing the output voltage at each collector. A pair of transistors are coupled one to each emitter follower for applying the sensed voltage across a neutralizing impedance proportional to the parasitic impedance seen at the collector of the opposite transistor of the common base amplifier. The voltage applied across the neutralizing impedances produces a correction current. The correction current is summed with a distortion current of proportional amount but opposite sign produced by the output voltage applied across the parasitic impedance to produce a substantially error-free output voltage.

5 Claims, 1 Drawing Figure

DIFFERENTIAL IMPEDANCE NEUTRALIZATION CIRCUIT

FIELD OF THE INVENTION

This invention generally relates to differential amplifiers. More particularly, this invention relates to a circuit for neutralizing undesired parasitic impedances which result from using large area devices in such amplifiers.

BACKGROUND OF THE INVENTION

The area of a transistor device within a differential amplifier circuit is normally minimized to reduce the effect of parasitic impedances such as collector-base capacitance $C_{cb}$ and collector-substrate capacitance $C_{cs}$ on the speed of the device. The larger these capacitances, the lower the bandwidth of the output signal. A smaller device, however, may not be optimally sized for the standing current density in the device. A mismatch of device area to current density lowers the transition frequency $f_T$ of the device from its maximum frequency and thus limits the device bandwidth. The standing current also determines the amount of load resistance and voltage swing that can be provided by the circuit. A number of tradeoffs therefore exist in the prior art among speed, bandwidth and maximum load of a device.

The present invention avoids these tradeoffs by neutralizing the effects of the parasitic capacitances. The device area can therefore be sized to accept the desired standing current whose density is chosen in response to the load resistance and projected voltage swing.

SUMMARY OF THE INVENTION

An object of the invention, therefore, is to neutralize the effects of parasitic impedance on the operation of a transistor device.

Another object of the invention is to enable a transistor device to be sized to accept the desired standing current to maximize the transition frequency of the device.

Yet another object of the invention is to provide a parasitic impedance and neutralization circuit whose parameters are easily determined.

To achieve these objects, a parasitic impedance neutralization circuit includes a means for sensing an output signal at each of the two output terminals of a differential amplifier and reproducing each output signal in isolation from each output terminal. Additional means coupled to the sensing means applies the isolated output signal from each terminal across neutralizing impedances that are proportional to the parasitic impedances at each output terminal. This applied output signal produces a correction signal proportional but of the opposite sign to the distortion signal produced by the parasitic impedance at the opposite terminal. The correction signal is passed to the opposite terminal to be summed with the distortion signal and provide a substantially error-free output signal.

In a preferred embodiment of the invention, the output voltage at each output terminal is sensed and isolated from the output terminal by an emitter follower. The isolated voltage is then applied by another transistor across a neutralizing impedance to produce the correction current. The neutralizing impedance is matched to the parasitic impedance by using a circuit element matched to the element producing the impedance. For example, in a differential amplifier, the neutralizing impedance is produced by using a transistor matched to the transistor of the amplifier from which the output voltage is taken.

DETAILED DESCRIPTION

Figure 1:
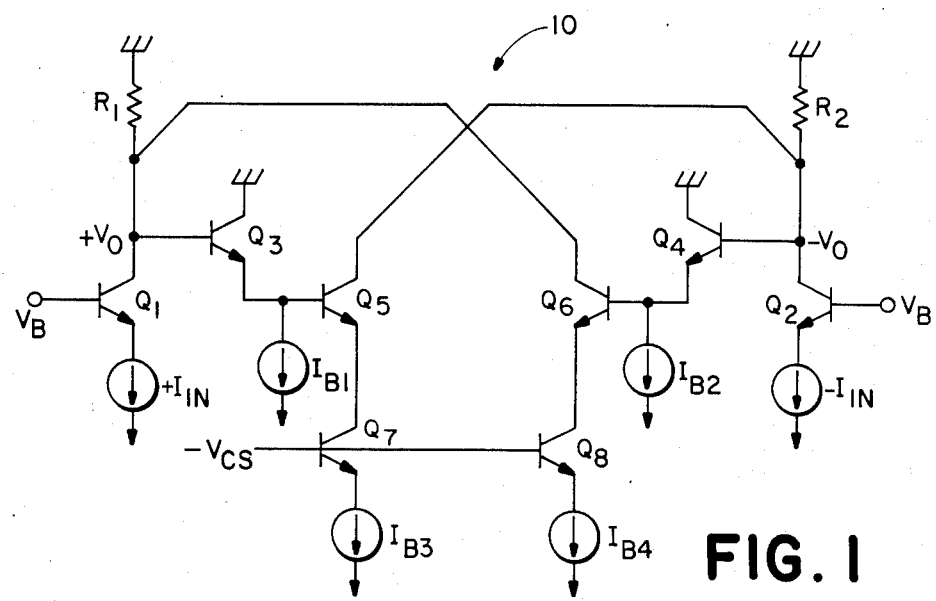
FIG. 1 is a schematic diagram of a differential amplifier including an impedance neutralization circuit according to the invention.

FIG. 1 shows a common base amplifier 10 that includes a neutralization circuit embodying the invention. The differential common base amplifier 10 is merely one example of amplifiers with which the neutralization circuit may be used. The neutralization circuit, which comprises transistor $Q_3$ through $Q_8$, may also be used with other differential amplifiers such as variable gain stages as well.

To review briefly the operation of a common-base differential amplifier 10 comprising $Q_1$ and $Q_2$, the input signal is provided through currents $+I_{in}$ and $-I_{in}$ which each include a standing or bias current portion and an input signal portion. These currents are produced by a differential stage so the increase in current in one source such as $+I_{in}$ is accompanied by a corresponding decrease in current in $-I_{in}$. A DC biasing voltage $V_B$, negative in this embodiment, is supplied to each transistor base to render $Q_1$ and $Q_2$ conductive. These transistors are matched to draw equal amounts of current when no input signal is present on $+I_{in}$ and $-I_{in}$.

The input signal is transmitted through $Q_1$ and $Q_2$ to output terminals at the collector of each transistor, where the input signal can be sensed as a differential voltage measured from $+V_o$ to $-V_o$, respectively. $+V_o$ and $-V_o$ are produced by the change in current through equal load resistors $R_1$ and $R_2$ connected to each output terminal. $V_o$ therefore includes a DC bias portion and a signal portion.

The impedance affecting $+V_o$ and $-V_o$ at each terminal, however, is not only the load resistance $R_1$ and $R_2$. At the first output terminal, for example, $Q_1$ includes a parasitic impedance that is in parallel to $R_1$. This impedance comprises a collector-base capacitance $C_{cb}$ and a collector-substrate capacitance $C_{cs}$, capacitances that cause midfrequency defects in the gain of the differential amplifier 10. This effect is especially pronounced in large area devices, where these capacitances are proportionately larger. In a physical sense, these capacitances produce a distortion signal at the output terminal by absorbing and providing current as $+V_o$ changes in response to the input signal. The distorting effect of this capacitance is best seen by simulating the circuit on a computer simulation program such as SPICE. The same distortion, but with opposite sign, occurs on $-V_o$ at the second output terminal.

The neutralization circuit that comprises transistors $Q_3$ through $Q_8$ neutralizes the effect of the capacitances on $+V_o$ and $-V_o$. $Q_3$ is an emitter follower that senses the signal voltage $+V_o$ at the first output terminal and reproduces $+V_o$ in isolation (at a slightly lower DC bias) so that $+V_o$ is not affected by the isolated voltage. $Q_3$ is biased by a standing current source $I_{B1}$. The voltage $+V_o$ is then transmitted to $Q_5$, which applies $+V_o$ across the collector of $Q_7$. The parasitic output impedance of $Q_7$ is proportional to the impedances of $Q_1$ and $Q_2$. In this embodiment the impedances can be equal because $Q_7$ is chosen to match those transistors. $Q_7$ is biased by a voltage $-V_{cs}$ and a current source $I_{B3}$ at a level sufficient to provide and absorb currents as required by $C_{cb}$ and $C_{cs}$. The collector of $Q_5$ is cross coupled to the second output terminal to pass a correction current to the terminal, the correction current produced by applying $+V_o$ across the impedance of $Q_7$.

Similarly, $Q_4$ is an emitter follower biased by current source $I_{B2}$. $Q_4$ senses $-V_o$ at the second output terminal and reproduces $-V_o$ in isolation from the terminal. Because $Q_8$ is matched to $Q_2$, the parasitic output impedance of $Q_8$ is proportional to that of $Q_1$ and $Q_2$. In this embodiment the impedances can be equal because of the transistor matching. $Q_8$ is biased by the voltage $-V_{cs}$ and a current source $I_{B4}$ at a level sufficient to provide and produce currents as required b $C_{cb}$ and $C_{cs}$. The collector of $Q_6$ is cross coupled to the first output terminal to pass a correction current to the terminal, the correction current produced by applying $-V_o$ across the impedance of $Q_8$.

In the operation of the neutralizing circuit, the correction currents are summed at each terminal with distortion currents that are proportional but of opposite sign. This proportion can be an equal proportion. For example, when a differential signal is applied to amplifier 10, $+V_o$ will rise (or fall) and $-V_o$ will correspondingly fall (or rise). As $+V_o$ rises at the first output terminal, it must charge $C_{cb}$ and $C_{cs}$ which thereby produce a distortion current that affects the rise of $+V_o$. Correspondingly, $-V_o$ falls at the second output terminal and causes $C_{cb}$ and $C_{cs}$ to discharge a distortion current that affects the fall of $-V_o$. These distortion currents are proportional but of opposite sign. Correction currents are produced in response. As $+V_o$ rises, it is applied across the neutralizing impedance of $Q_7$ to produce a correction current proportional to the distortion current affecting $-V_o$. The correction current is transmitted via the collector $Q_5$ to the second output terminal. In this case, the correction current is drawn out of the second terminal to match the current added thereto by $C_{cb}$ and $C_{cs}$. As $-V_o$ drops, on the other hand, it is applied across the proportional neutralizing impedance of $Q_8$ to produce a correction current for the first terminal. In this case, the current drawn into the collector of $Q_6$ decreases because $-V_o$ has decreased, effectively "pushing" current into the first output terminal proportional to the distortion current drawn off the terminal by the charging of $C_{cb}$ and $C_{cs}$.

The coupling of the neutralizing circuit to the output terminals and amplifier 10 changes the DC bias portion, but this change does not affect the input signal portion. The DC voltage bias portion of $+V_o$ at the base of $Q_5$ is shifted a diode voltage drop below the DC bias portion of $-V_o$ at the second terminal to ensure $Q_5$ is biased properly. Similarly, the DC bias portion of $-V_o$ at the base of $Q_6$ is shifted below the DC bias portion of $+V_o$ at the first terminal to ensure proper operation of $Q_6$.

The neutralization circuit 12, of course, is not limited to matching parasitic impedance of a bipolar transistor in a differential amplifier. The circuit could as well be used for matching parasitic impedances produced by other elements such as Darlington pairs, field effect transistors, passive devices, wiring or interconnections.

Having illustrated and described the principles of the invention in a preferred embodiment, it should be apparent to those skilled in the art that the invention can be modified in arrangement and detail without departing from such principles. I claim all medifications coming within the spirit and scope of the following claims.

I claim:

1. A parasitic impedance neutralization circuit for an amplifier, comprising:

means for sensing an output signal at opposing output terminals of the amplifier and reproducing each output signal in isolation from each output terminal, the parasitic impedance at each terminal producing a distortion signal;

neutralizing impedances proportional to the parasitic impedances at each output terminal;

means coupled to the sensing means for applying the isolated output signal from each terminal across a neutralizing impedance to produce a correction signal proportional to but opposite in sign to the distortion signal produced by the parasitic impedance at the opposite terminal; and means for passing each correction signal to the opposite terminal to be summed with the distortion signal to provide a substantially error-free output signal.

2. The neutralization circuit of claim 1 in which the sensing means comprises an emitter follower.

3. The neutralization circuit of claim 1 in which the neutralizing impedance is provided by an element matched to the element of the amplifier producing the parasitic impedance.

4. A parasitic impedance neutralization circuit for an amplifier having a pair of transistors, comprising:

an emitter follower coupled to the collector of each transistor of the pair to sense the output voltage at each collector and reproduce each voltage in isolation from the collector voltages;

a neutralizing impedance proportional to the parasitic impedance at the collector of the opposite transistor of the pair;

a transistor having its base coupled to the emitter follower for receiving the isolated output voltage therefrom and applying the voltage across the neutralizing impedance to produce a correction current, each transistor having its collector cross coupled to the collector of the opposite transistor of the pair to pass the correction current to the opposite transistor, the correction current summed with a distortion current produced at the opposite transistor to produce a substantially error-free output signal.

5. The neutralization circuit of claim 4 in which each neutralizing impedance is provided by a transistor matched to the emitter coupled transistor producing the parasitic impedance at each output terminal.

* * * * *